(12) United States Patent
Izumi

(10) Patent No.: US 8,912,761 B2
(45) Date of Patent: Dec. 16, 2014

(54) UPPER-LIMIT OF STATE-OF-CHARGE ESTIMATING DEVICE AND UPPER-LIMIT OF STATE-OF-CHARGE ESTIMATING METHOD

(75) Inventor: Junta Izumi, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 537 days.

(21) Appl. No.: 13/379,965

(22) PCT Filed: Jun. 23, 2010

(86) PCT No.: PCT/IB2010/001510
§ 371 (c)(1),
(2), (4) Date: Dec. 21, 2011

(87) PCT Pub. No.: WO2010/150076
PCT Pub. Date: Dec. 29, 2010

(65) Prior Publication Data
US 2012/0091969 A1    Apr. 19, 2012

(30) Foreign Application Priority Data
Jun. 24, 2009    (JP) ................. 2009-149936

(51) Int. Cl.
*H02J 7/00* (2006.01)
*B60L 11/18* (2006.01)
*G01R 31/36* (2006.01)

(52) U.S. Cl.
CPC ........... *B60L 11/1862* (2013.01); *G01R 31/361* (2013.01); *G01R 31/3679* (2013.01); *Y02T 10/7005* (2013.01); *Y02T 10/705* (2013.01); *Y02T 10/7044* (2013.01)
USPC ........... 320/148; 324/426; 324/427; 324/428; 320/132

(58) Field of Classification Search
USPC .................... 324/426, 427, 428; 320/132, 148
See application file for complete search history.

(56) References Cited

U.S. PATENT DOCUMENTS

| | | | |
|---|---|---|---|
| 2006/0276981 A1* | 12/2006 | Aridome | 702/64 |
| 2008/0150491 A1* | 6/2008 | Bergveld et al. | 320/139 |
| 2008/0197807 A1* | 8/2008 | Simopoulos et al. | 320/132 |

FOREIGN PATENT DOCUMENTS

| | | |
|---|---|---|
| EP | 1975636 A2 | 10/2008 |
| JP | 2003-068369 A | 3/2003 |
| JP | 2005-010032 A | 1/2005 |
| JP | 2005-083970 A | 3/2005 |
| JP | 2008-220080 A | 9/2008 |
| JP | 2008-220121 A | 9/2008 |
| WO | 2008026476 A1 | 3/2008 |

\* cited by examiner

*Primary Examiner* — Drew A Dunn
*Assistant Examiner* — Nathaniel Pelton
(74) *Attorney, Agent, or Firm* — Gifford, Krass, Sprinkle, Anderson & Citkowski, P.C.

(57) ABSTRACT

A PM-ECU executes a program including: a step (S104) of estimating pre-charge SOC(1) when a plug-in charge is started (YES in S100), a step (S108) of calculating an integrated value of charging current when integration permitting conditions are satisfied (YES in S104, YES in S106), a step (S112) of setting a final integrated value when the charge is completed, a step (S116) of estimating post-charge SOC(2) when an ignition switch is turned on (YES in S114), a step (S122) of calculating a full-charge capacity of this cycle when calculation conditions are satisfied (YES in S120), a step (S128) of calculating a new full-charge capacity when the full-charge capacity of this cycle is within a specified range (YES in S124), and a step (S130) of updating the full-charge capacity by setting the new full-charge capacity as the current full-charge capacity when the new full-charge capacity is within a specified range (YES in S128).

12 Claims, 6 Drawing Sheets

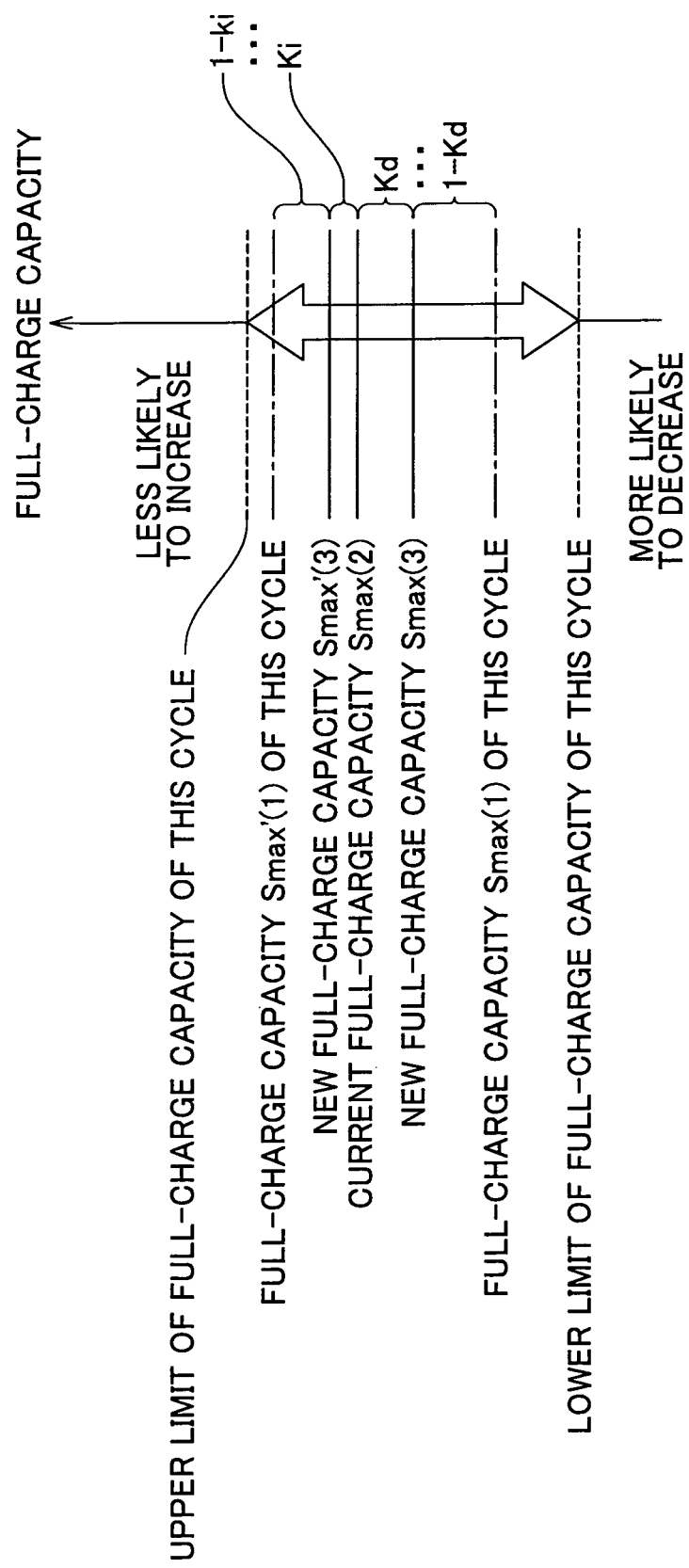

UPPER-LIMIT OF STATE-OF-CHARGE ESTIMATING DEVICE AND UPPER-LIMIT OF STATE-OF-CHARGE ESTIMATING METHOD

BACKGROUND OF THE INVENTION

1. Field of the Invention

The invention relates to the technology of estimating the upper limit of the state of charge of a storage device that is installed on a vehicle and can be externally charged (i.e., charged with an external power supply). In particular, the invention is concerned with the technology of estimating the upper limit, based on the states of charge of the storage device before and after the external charging.

2. Description of the Related Art

A secondary battery that is installed on a vehicle including a dynamo-electric machine or machines as a power source and supplies electric power to the dynamo-electric machine(s) is repeatedly charged and discharged; therefore, the upper limit of the state of charge (which will also be referred to as "full-charge capacity") of the secondary battery decreases with time due to its chronological changes. As the full-charge capacity decreases, the distance over which the vehicle can travel with the dynamo-electric machine(s) is reduced. Therefore, it is necessary to detect a reduction of the full-charge capacity with high accuracy so as to accurately grasp the distance over which the vehicle can travel with the dynamo-electric machine(s).

Japanese Patent Application Publication No. 2003-068369 (JP-A-2003-068369) discloses a method of detecting the total capacity of a secondary battery, with the objective of easily detecting the total capacity of the secondary battery. According to the method disclosed in the above-identified publication, the total capacity of the secondary battery is detected based on an integrated current value obtained by integrating charging/discharging current over a period of transition from a first state in which no charging/discharging current flows in the secondary battery for a given time or longer to a second state in which no charging/discharging current flows in the secondary battery again for a given time or longer, and a difference between the charge level in the first state and the charge level in the second state. The method is characterized in that voltages of the secondary battery in the first state and the second state are measured, and each of the charge levels is determined based on a preliminarily acquired relationship between the voltage of the secondary battery and the charge level.

According to the method disclosed in the above-identified publication, the total capacity of the secondary battery can be easily detected.

However, since the state of charge of the secondary battery varies largely due to charging or discharging during running of the vehicle, the reduction of the full-charge capacity of the secondary battery may not be detected with high accuracy. In the above-described method of detecting the total capacity of the secondary battery, this problem is not taken into consideration.

SUMMARY OF THE INVENTION

The invention provides a state-of-charge estimating device that estimates the upper limit of the state of charge of a storage device with high accuracy, and such a state-of-charge estimating method.

A first aspect of the invention is concerned with a state-of-charge estimating device for estimating an upper limit of the state of charge of a storage device that is installed on a vehicle and can be charged using a charging device outside the vehicle. The state-of-charge estimating device includes first estimating means for estimating a first state of charge of the storage device when the storage device starts being charged by the charging device, integrating means for calculating an integrated value of charging current over a period of time from start of charging of the storage device by the charging device to completion of the charging, second estimating means for estimating a second state of charge of the storage device at the completion of the charging of the storage device by the charging device, third estimating means for estimating a first upper limit of the state of charge, based on the first state of charge, the second state of charge, and the integrated value of charging current, and calculating means for calculating a final third upper limit of the state of charge in a current control cycle, based on the first upper limit, and the final second upper limit of the state of charge calculated in a last control cycle.

According to the first aspect of the invention as described above, the use of the charging device outside the vehicle makes it possible to charge the storage device with a constant charging current. Therefore, the integrated value of charging current can be calculated with high accuracy. Also, since the storage device is charged using the external charging device while the vehicle is at rest or stopped, large variations are less likely or unlikely to appear in the state of charge of the secondary battery. Therefore, the first state of charge of the storage device at the time of start of charging and the second state of charge of the storage device at the completion of charging can be calculated with high accuracy. Accordingly, the upper limit of the state of charge of the storage device can be estimated with high accuracy, based on the first state of charge, second state of charge, and the integrated value of charging current. Thus, the invention provides the state-of-charge estimating device and state-of-charge estimating method for estimating the upper limit of the state of charge of the storage device with high accuracy.

In the first aspect of the invention, the calculating unit may calculate the third upper limit when the first upper limit is within a specified range defined by a predetermined upper limit and a predetermined lower limit.

In the first aspect of the invention, the calculating means may calculate the third upper limit using a first weight, based on the first upper limit and the second upper limit, when the first upper limit is smaller than the second upper limit. Also, the calculating means may calculate the third upper limit using a second weight that is different from the first weight, based on the first upper limit and the second upper limit, when the first upper limit is equal to or larger than the second upper limit.

In the first aspect of the invention, the calculating means may calculate the third upper limit using a first weight, based on the first upper limit and the second upper limit, when the first upper limit is equal to or smaller than the second upper limit. Also, the calculating means may calculate the third upper limit using a second weight that is different from the first weight, based on the first upper limit and the second upper limit, when the first upper limit is larger than the second upper limit.

Generally, the upper limit of the state of charge of the storage device has a tendency of decreasing with time due to its chronological changes. In some cases, however, the upper limit of the state of charge calculated in this control cycle may increase to be larger than the upper limit calculated in the last cycle, due to measurement errors, or the like. Therefore, when the third upper limit is calculated based on the first upper limit of the state of charge obtained in this cycle and the final second upper limit obtained in the last cycle, different weights are assigned to the upper limits, depending upon whether the first upper limit is larger or smaller the second upper limit, so as to change the tendency of increase or reduction of the third upper limit. Thus, the third upper limit can be changed in agreement with chronological changes of the storage device.

In the first aspect of the invention, the first weight assigned to the first upper limit is set to be larger than the second weight assigned to the first upper limit.

By setting the first weight so that the first weight assigned to the first upper limit is larger than the second weight assigned to the first upper limit, the third upper limit is more likely to be reduced when the first upper limit is reduced to be smaller than the second upper limit, and the third upper limit is less likely to be increased when the first upper limit is increased to be larger than the second upper limit. Thus, the tendency of increase or reduction of the third upper limit is changed, so that the third upper limit can be changed in agreement with chronological changes of the storage device. Therefore, the upper limit of the state of charge of the storage device can be detected with high accuracy.

In the first aspect of the invention, when the third upper limit is within a specified range defined by a predetermined upper limit and a predetermined lower limit, the calculating means replaces the final second upper limit of the state of charge calculated in the last control cycle, with the third upper limit, so as to set the third upper limit as a current full-charge capacity.

A second aspect of the invention is concerned with a state-of-charge estimating method for estimating an upper limit of the state of charge of a storage device that is installed on a vehicle and can be charged using a charging device outside the vehicle. The state-of-charge estimating method includes steps corresponding to the respective elements or means of the state-of-charge estimating device according to the first aspect of the invention, and provides the same effects as those of the first aspect of the invention.

BRIEF DESCRIPTION OF THE DRAWINGS

The foregoing and further objects, features and advantages of the invention will become apparent from the following description of an exemplary embodiment with reference to the accompanying drawings, wherein like numerals are used to represent like elements and wherein:

FIG. 6 is a view showing the results of calculation of the full-charge capacity.

DETAILED DESCRIPTION OF THE EMBODIMENT

Figure 1:
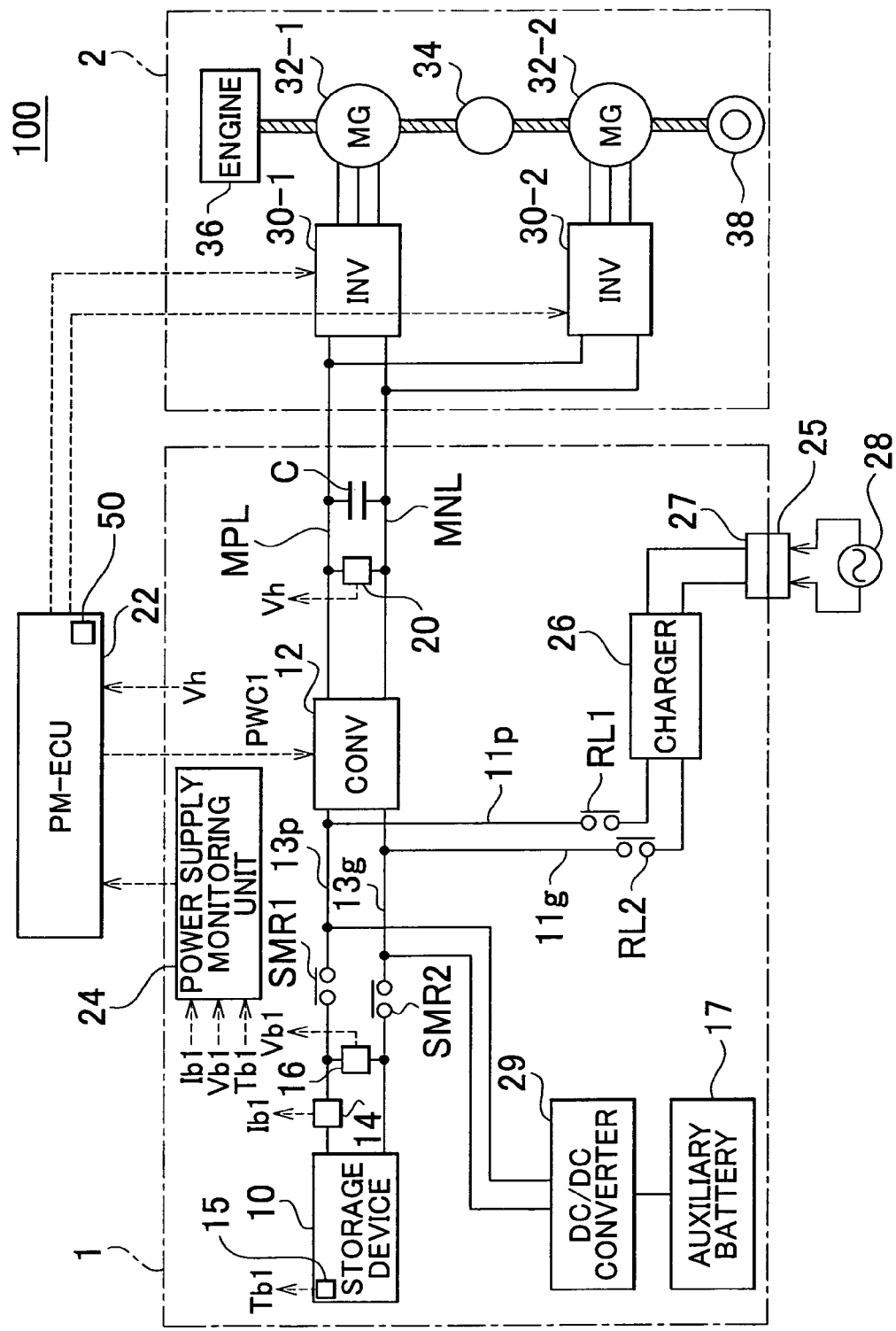
FIG. 1 is an overall block diagram of a vehicle on which a state-of-charge estimating device according to one embodiment of the invention is installed.

One embodiment of the invention will be described with reference to the drawings. In the following description, the same reference numerals are assigned to the same components, which have the same names and the same functions. Thus, detailed description of these components will not be repeated.

FIG. 1 is an overall block diagram of a vehicle 100 on which a state-of-charge estimating device according to the embodiment of the invention is installed. While the vehicle 100 is in the form of a hybrid vehicle in this embodiment, the vehicle 100 may be an electric vehicle that includes a motor-generator as a power source, but dos not include any engine.

As shown in FIG. 1, the vehicle 100 includes a power supply system 1, a driving force generating unit 2, and a PM(Powertrain Manger)-ECU(Electronic Control Unit) 22. The driving force generating unit 2 includes a first inverter 30-1, second inverter 30-2, first MG (Motor-Generator) 32-1, second MG 32-2, power split device 34, engine 36, and driving wheels 38.

The first MG 32-1, second MG 32-2 and the engine 36 are coupled to the power split device 34. With this arrangement, the vehicle 100 runs with the driving force obtained from at least one of the engine 36 and the second MG 32-2. The power split device 34 splits power generated by the engine 36 into two paths. Namely, the power of the engine 36 is transmitted to the driving wheels 38 via one of the two paths, and is transmitted to the first MG 32-2 via the other path.

Each of the first MG 32-1 and the second MG 32-2 is an ac dynamo-electric machine, for example, a three-phase ac dynamo-electric machine including a rotor in which permanent magnets are embedded. The first MG 32-1 generates electric power using the power of the engine 36 split by the power split device 34. For example, when the state of charge (which will be referred to as "SOC") of a storage device 10 (which will be described later) included in the power supply system 1 is reduced, the engine 36 is started so that the first MG 32-1 generates electric power, and the generated electric power is supplied to the power supply system 1.

The second MG 32-2 generates driving force, using at least one of electric power supplied from the power supply system 1 and electric power generated by the first MG 32-1. The driving force of the second MG 32-2 is transmitted to the driving wheels 38. During braking of the vehicle, for example, the second MG 32-2 is driven by the driving wheels 38 so that the second MG 32-2 operates as a generator. Thus, the second MG 32-2 operates as a regenerative braking system that converts braking energy into electric power. The electric power generated by the second MG 32-2 is then supplied to the power supply system 1.

The power split device 34 consists of planetary gears including a sun gear, pinion gears, a carrier and a ring gear. The pinion gears engage with the sun gear and the ring gear. The carrier supports the pinion gears such that the pinion gears are rotatable about themselves, and is coupled to the crankshaft of the engine 36. The sun gear is coupled to a rotary shaft of the first MG 32-1. The ring gear is coupled to a rotary shaft of the second MG 32-2.

Each of the first inverter 30-1 and the second inverter 30-2 is connected to a main positive line MPL and a main negative line MNL. The first inverter 30-1 and the second inverter 30-2 covert the driving electric power (dc power) supplied from the power supply system 1 into ac power, and output the ac power to the first MG 32-1 and the second MG 32-2, respectively. Also, the first inverter 30-1 and the second inverter 30-2 convert ac power generated by the first MG 32-1 and the second MG 32-2, respectively, into dc power, and output the dc power as regenerative electric power to the power supply system 1.

Each of the first inverter 30-1 and the second inverter 30-2 includes, for example, a bridge circuit including switching devices for three phases. Each of the first inverter 30-1 and the second inverter 30-2 drives the corresponding MG by performing switching operations according to a drive signal from the PM-ECU 22.

The PM-ECU 22 has the function of controlling the whole system (1, 2) in an integrated manner during running of the vehicle 100 and during external charging. The PM-ECU 22 is configured to accomplish desired control functions by performing certain computations through execution of programs stored in advance in an internal memory 50, or performing certain operations by hardware, such as electronic circuits.

The PM-ECU 22 calculates vehicle's required power Ps (i.e., power Ps required of the vehicle) based on detection signals of various sensors (not shown), running conditions, and the accelerator pedal position, for example, and calculates target values of the torque and rotational speed of the first MG 32-1 and those of the second MG 32-2, based on the calculated vehicle's required power Ps. The PM-ECU controls the first inverter 30-1 and the second inverter 30-2 so that the torques generated by the first MG 32-1 and the second MG 32-2 and their rotational speeds become equal to the respective target values. When the vehicle's required power Ps is a positive value, electric power is supplied from the power supply system 1 to the driving force generating unit 2. When the vehicle's required power Ps is a negative value, regenerative electric power is supplied from the driving force generating unit 2 to the power supply system 1.

In the meantime, the power supply system 1 includes the above-mentioned storage device 10, converter 12, main positive line MPL, main negative line MNL, and a smoothing capacitor C. The power supply system 1 further includes a power supply monitoring unit 24, current sensor 14, temperature sensor 15, and voltage sensors 16, 20.

The storage device 10 is a rechargeable dc power supply, and is in the form of, for example, a secondary battery, such as a nickel metal hydride (NiMH) battery or a lithium-ion battery, or a large capacitance capacitor. The storage device 10 is connected to the converter 12 via a power supply cable 13p and a ground cable 13g. System main relays SMR1, SMR2 are provided at some points in the power supply cable 13p and the ground cable 13g, respectively.

The converter 12 is connected to the main positive line MPL and the main negative line MNL. The converter 12 performs voltage transformation between voltage of the storage device 10 and voltage between the main positive line MPL and the main negative line MNL, based on a drive signal PWC1 from the PM-ECU 22.

The smoothing capacitor C is connected between the main positive line MPL and the main negative line MNL, and is operable to reduce electric-power varying components included in the main positive line MPL and main negative line MNL. The voltage sensor 20 detects voltage Vh between the main negative line MNL and the main positive line MPL, and outputs detected values of the voltage Vh to the PM-ECU 22.

The current sensor 14 detects electric current Ib1 that flows into and out of the storage device 10, and outputs detected values of the current Ib1 to the power supply monitoring unit 24. The current sensor 14 detects current (discharging current) flowing out of the storage device 10 as a positive value, and detects current (charging current) flowing into the storage device 10 as a negative value. While FIG. 1 illustrates the case where the current sensor 14 detects current flowing in the positive line, the current sensor 14 may detect current flowing in the negative line.

The temperature sensor 15 detects the temperature Tb1 of the storage device 10, and outputs detected values of the temperature Tb1 to the power supply monitoring unit 24. The voltage sensor 16 detects voltage Vb1 of the storage device 10, and outputs detected values of the voltage Vb1 to the power supply monitoring unit 24.

The power supply monitoring unit 24 outputs the current Ib1 received from the current sensor 14, the temperature Tb1 received from the temperature sensor 15, and the voltage Vb1 received from the voltage sensor 16, to the PM-ECU 22.

The power supply monitoring unit 24 may output the current Ib1, voltage Vb1 and the temperature Tb1 to the PM-ECU 22 at predetermined calculation cycles or intervals, or may output the average values of the current Ib1, voltage Vb1 and temperature Tb1 obtained at predetermined time intervals longer than the predetermined calculation cycles, to the PM-ECU 22.

The PM-ECU 22 creates a drive signal PWC1 for driving the converter 12, based on the current Ib1 and voltage Vb1 received from the power supply monitoring unit 24, and the vehicle's required power Ps. Then, the PM-ECU 22 outputs the created drive signal PWC1 to the converter 12, so as to control the converter 12. The PM-ECU 22 controls the converter 12 so as to regulate the voltage Vh to a certain target voltage.

The power supply system 1 further includes an auxiliary battery 17 for accessories and a DC/DC converter 29, as a part of a low-voltage system (auxiliary system).

The auxiliary battery 17 is, for example, a lead storage battery. The output voltage of the auxiliary battery 17 is equivalent to the power supply voltage of the low-voltage system. The power supply voltage of the low-voltage system is lower than the output voltage of the storage device 10, and is equal to, for example, about 12V.

The DC/DC converter 29 steps down dc voltage equivalent to the output voltage of the storage device 10, so as to generate the power supply voltage of the low-voltage system.

The power supply system 1 further includes a charger 26, a charger connector 27, relays RL1, RL2, a power supply cable 11p and a ground cable 11g, which constitute an arrangement for externally charging the storage device 10.

The charger connector 27 is electrically connected to a power supply outside the vehicle (which will be called "external power supply") 28 when it is connected to a charging plug 25 provide at an end portion of a charging cable connected to the external power supply 28. The charging cable may incorporate a relay that is operable to cut off a charging path of the external power supply 28. Generally, the external power supply 28 consists of a commercially available ac power supply.

The arrangement shown in FIG. 1 may be replaced by an arrangement in which the external power supply 28 and the vehicle 100 are electromagnetically coupled to each other in a non-contact manner for supply of electric power from the power supply 28 to the vehicle 100. More specifically, a primary coil may be provided on the external power supply side while a secondary coil may be provided on the vehicle side, and the mutual inductance between the primary coil and the secondary coil may be utilized so that electric power is supplied from the external power supply 28 to the vehicle 100. Even where external charging is effected in this way, the charger 26 that converts electric power supplied from the external power supply 28 and other components downstream of the charger 26 may be constructed or arranged in the same manner as that of FIG. 1.

The charger connector 27 and the charger 26 are electrically connected by a power supply cable, etc. The charger 26 converts ac voltage from the external power supply 28 into dc voltage used for charging the storage device 10. The resultant dc voltage is delivered to the power supply cable 11p and ground cable 11g.

The relay RL1 is electrically connected to a certain point of the power supply cable 11p. The relay RL2 is electrically connected to a certain point of the ground cable 11g.

Each of the relays RL1 and RL2 is an electromagnetic relay that conducts (i.e., is placed in the ON position) when exciting current is supplied from an excitation circuit (not shown) to the relay, and releases (i.e., is placed in the OFF position) when no exciting current is supplied. It is to be understood that a suitable circuit element may be used as the relay provided that the element is a switch capable of controlling conduction (ON)/disconnection (OFF) of a current-carrying path.

When the charger 26 charges the storage device 10 using electric power supplied from the external power supply 28 (this type of charging will also be referred to as "external charging" or "plug-in charging or charge" in the following description), the system main relays SMR1, SMR2 and the relays RL1, RL2 are placed in the ON positions. As a result, dc voltage into which ac electric power from the external power supply 28 is converted by the charger 26 is transmitted to the power supply cable 13p. The dc voltage transmitted from the charger 26 to the power supply cable 13p is used for charging the storage device 10.

The dc voltage transmitted to the power supply cable 13p is also transmitted to the DC/DC converter 29. Accordingly, the DC/DC converter 29 can generate a power supply voltage for the low-voltage system, using the electric power supplied from the external power supply 28. During external charging, the converter 12 is driven as needed, so that charging power is supplied from the charger 26 to the storage device 10.

In the vehicle constructed as described above, the state of charge of the storage device 10 varies largely due to charging and discharging during running of the vehicle; therefore, reduction of the upper limit of the state of charge (SOC) of the storage device 10 may not be detected with high accuracy. In this connection, "full-charge capacity" represents the upper limit of the SOC of the storage device 10.

This embodiment of the invention is characterized in that the PM-ECU 22 operates in the following manners. The PM-ECU 22 estimates SOC(1) of the storage device 10 when external charging is started. The PM-ECU 22 integrates charging current over a period of time from the start of external charging to completion of charging of the storage device 10. The PM-ECU 22 estimates SOC(2) of the storage device 10 at the completion of the external charging. The PM-ECU 22 estimates the full-charge capacity Smax(1) of the storage device 10 for this control cycle, based on the SOC(1), SOC(2) and the integrated value of charging current over the time from the start of external charging to the completion of external charging. The PM-ECU 22 calculates the final full-charge capacity Smax(3) of this cycle (which will also be referred to as "new full-charge capacity Smax(3)" in the following description), based on the full-charge capacity Smax(1) of this cycle, and the current full-charge capacity (i.e., the full-charge capacity finally calculated in the last control cycle) Smax(2).

Figure 2:
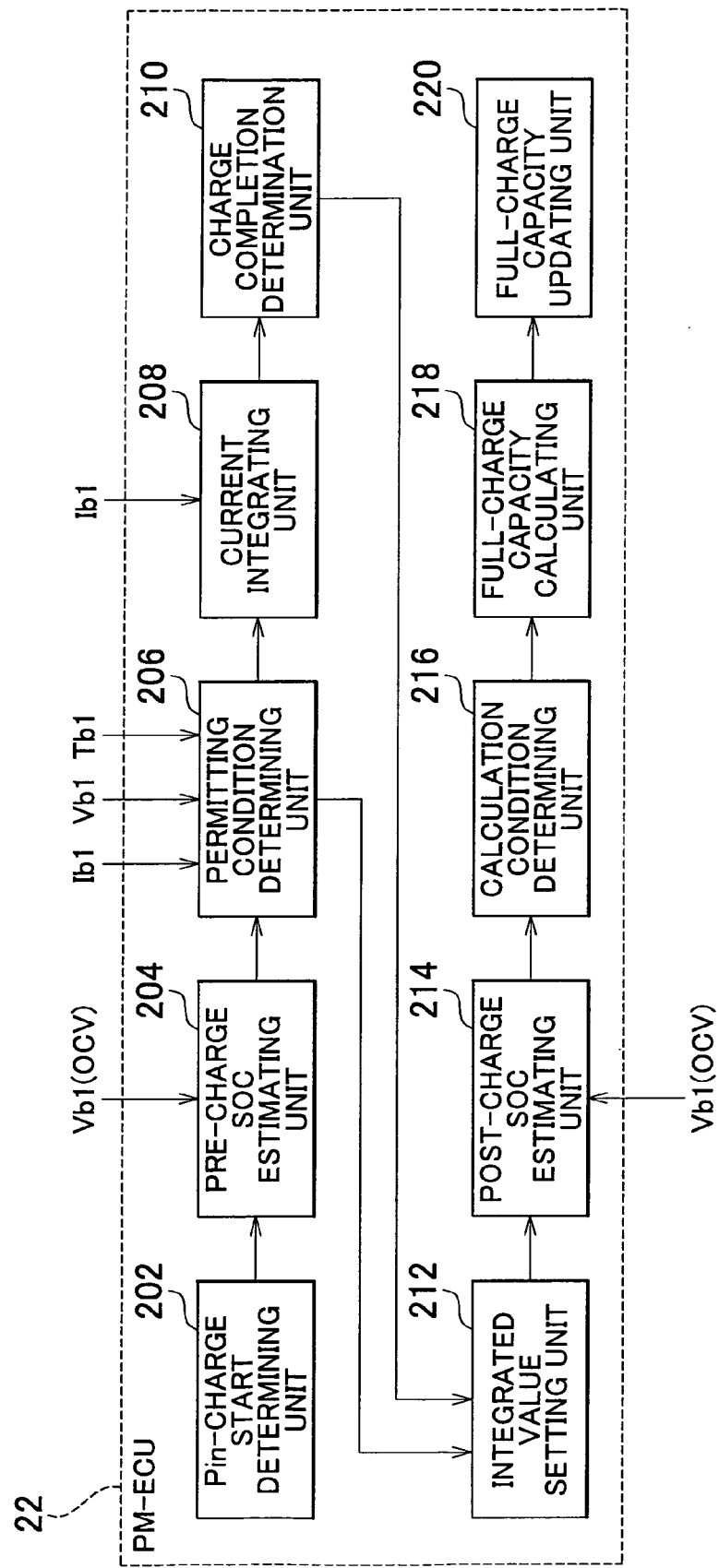
FIG. 2 is a functional block diagram of a PM-ECU as the state-of-charge estimating device according to the embodiment of FIG. 1.

FIG. 2 is a functional block diagram of the PM-ECU 22 as the state-of-charge estimating device according to this embodiment of the invention.

The PM-ECU 22 includes a Pin-charge start determining unit 202, pre-charge SOC estimating unit 204, permitting condition determining unit 206, current integrating unit 208, charge completion determining unit 210, integrated value setting unit 212, post-charge SOC estimating unit 214, calculation condition determining unit 216, full-charge capacity calculating unit 218, and a full-charge capacity updating unit 220.

The Pin-charge start determining unit 202 determines whether it is the time of start of plug-in charge. In this embodiment, the Pin-charge start determining unit 202 determines that it is the time of start of plug-in charge when the charging plug 25 is connected to the charger connector 27. However, the invention is not particularly limited to this. For example, the Pin-charge start determining unit 202 may determine that it is the time of start of plug-in charge when the charger 26 delivers dc voltage, or may determine that it is the time of start of plug-in charge when the relays RL1, RL2 are placed in the ON positions. The Pin-charge start determining unit 202 may also determine that it is the time of start of plug-in charge when it is determined that a plug-in charge needs to be started, such as when the SOC of the storage device 10 is equal to or less than a predetermined value, after the charging plug 25 is connected to the charger connector 27. It may be determined whether it is the time of start of plug-in charge before the system main relays SMR1, SMR 2 are placed in the ON positions.

The Pin-charge start determining unit 202 may set a start determination flag to ON when it determines that it is the time of start of plug-in charge.

When the Pin-charge start determining unit 202 determines that it is the time of start of plug-in charge, the pre-charge SOC estimating unit 204 estimates the SOC(1) of the storage device 10 prior to the plug-in charge.

The pre-charge SOC estimating unit 204 makes use of a fact that an open-circuit voltage (which will be referred to as "OCV" (Open Circuit Voltage)) of the storage device 10 varies along a line or curve having a certain slope, with respect to the SOC, and estimates the SOC(1) from the relationship between the OCV and the SOC.

Figure 3:
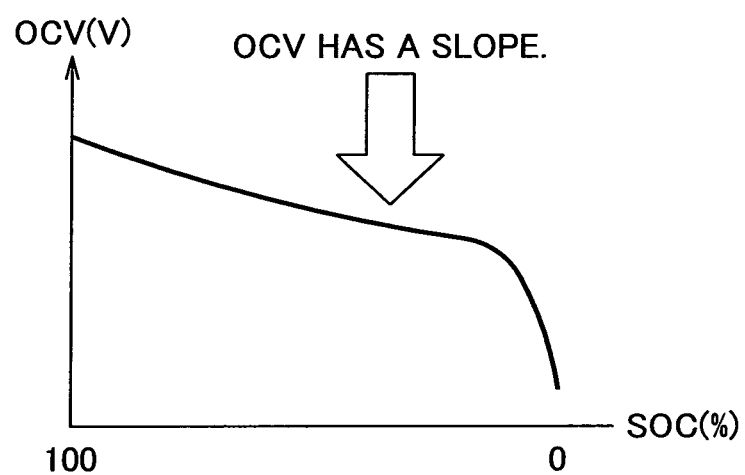
FIG. 3 is a graph showing the relationship between SOC and OCV.

For example, the SOC-OCV curve of the storage device 10 as shown in FIG. 3 is characterized in that the OCV varies along a curve having a slope as the SOC varies. The vertical axis of the graph of FIG. 3 indicates the OCV, and the horizontal axis of FIG. 3 indicates the SOC. The SOC-OCV curve shown in FIG. 3 is a mere example, and the relationship between the OCV and the SOC differs or varies depending on the type of the battery of the storage device 10.

The pre-charge SOC estimating unit 204 calculates the voltage Vb1 received from the power supply monitoring unit 24 while the system main relays SMR1, SMR2 are still in the OFF positions, as the OCV. The pre-charge SOC estimating unit 204 estimates the SOC(1), based on the calculated OCV, and the SOC-OCV curve as shown in FIG. 3.

Alternatively, the pre-charge SOC estimating unit 204 may calculate the OCV, even after the system main relays SMR1, SMR2 are turned ON, by correcting the voltage Vb received from the power supply monitoring unit 24 so as to compensate for influences of, for example, polarization, internal resistance, or the like. The method of estimating the SOC is not particularly limited to the above-described methods, but known techniques may be used.

The pre-charge SOC estimating unit 204 may estimate the SOC(1) when the start determination flag changes from OFF to ON, for example.

The permitting condition determining unit 206 determines whether conditions for permitting integration of charging current are satisfied. The permitting conditions include, for example, conditions concerning the current Ib1, voltage Vb1 and temperature Tb1 received from the power supply monitoring unit 24, and the SOC(1).

For example, the permitting conditions include a condition that the values of the current Ib1 received from the power supply monitoring unit 24 at predetermined time intervals are larger than a predetermined lower limit and smaller than a predetermined upper limit.

The permitting conditions also include a condition that the values of the voltage Vb1 received from the power supply monitoring unit 24 at predetermined time intervals are larger than a predetermined lower limit and smaller than a predetermined upper limit.

The permitting conditions further include a condition that the temperatures Tb1 received from the power supply monitoring unit 24 at predetermined time intervals are higher than a predetermined lower limit and lower than a predetermined upper limit. Furthermore, the permitting conditions include a condition that the SOC(1) is equal to or smaller than a predetermined value.

For example, the permitting condition determining unit 206 may determine whether the permitting conditions are satisfied after the SOC(1) is estimated, and may set a permission determination flag to ON when it determines that the permitting conditions are satisfied.

The current integrating unit 208 calculates an integrated value of charging current. More specifically, the current integrating unit 208 integrates the current Ib1 received from the power supply monitoring unit 24 at predetermined time intervals, over a period of time from start of plug-in charge to completion of charging of the storage device 10.

The charge completion determining unit 210 determines whether the plug-in charge is completed. The charge completion determining unit 210 may determine that the plug-in charge is completed when the charging plug 25 is disconnected from the charger connector 27, or may determine that the plug-in charge is completed when the charger 26 stops delivering dc voltage. The charge completion determining unit 210 may also determine that the plug-in charge is completed when the relays RL1, RL2 are placed in the OFF positions, or may determine that the plug-in charge is completed when it is determined that no plug-in charge is needed, such as when the SOC of the storage device 10 is equal to or larger than a predetermined value.

For example, the charge completion determining unit 210 may start determining whether the plug-in charge is completed after the current integrating unit 208 starts calculating the integrated value of charging current, and may set a completion determination flag to ON when it determines that the plug-in charge is completed.

When it is determined that the plug-in charge is completed, the integrated value setting unit 212 sets the integrated value calculated by the current integrating unit 208 as a final integrated value Ie. If the permitting condition determining unit 206 determines that one or more of the permitting conditions are not satisfied, the integrated value setting unit 212 sets a predetermined value that represents cancellation of estimation of the full-charge capacity, as the final integrated value Ie.

Also, the integrated value setting unit 212 sets the predetermined value that represents cancellation of estimation of the full-charge capacity, as the final integrated value Ie, when the SOC of the storage device 10 obtained when it is determined that the plug-in charge is completed is equal to or smaller than a predetermined value.

The predetermined value that represents cancellation of estimation of the full-charge capacity is defined as a value as follows: if the full-charge capacity Smax(1) of this control cycle is calculated using this value (i.e., the predetermined value), the calculated Smax(1) would not fall within a specified range, namely, the calculated Smax(1) would exceed a predetermined upper limit or falls below a predetermined lower limit.

The integrated value setting unit 212 may set the final integrated value Ie, for example, when the completion determination flag is set to ON, or the permission determination flag is set to OFF.

The post-charge SOC estimating unit 214 estimates the post-charge SOC(2) at the completion of the plug-in charge. In this embodiment, when the ignition switch is turned ON, such as when a start switch (not shown) is operated by the driver, after completion of the plug-in charge, the post-charge SOC estimating unit 214 calculates the OCV of the storage device 10 before the system main relays SMR1, SMR2 are placed in the ON positions, and estimates the SOC(2) based on the calculated OCV. The SOC is estimated based on the OCV in the manner as described above, and detailed description of the SOC estimating method will not be repeated.

The post-charge SOC estimating unit 214 may estimate the SOC (2) after a predetermined time elapses from the completion of the plug-in charge. The predetermined time is a length of time it takes from completion of the plug-in charge until the OCV value that has increased due to an influence, such as polarization, caused by charging becomes close to or equal to the actual value (corresponding to the SOC). In this manner, the post-charge SOC(2) can be estimated with high accuracy.

Alternatively, the post-charge SOC estimating unit 214 may estimate the SOC(2) immediately after the plug-in charge is completed. For example, the post-charge SOC estimating unit 214 may estimate the SOC(2) after the OCV obtained immediately after the completion of the charge is corrected to a value corresponding to the SOC.

The post-charge SOC estimating unit 214 may correct the OCV obtained immediately after the completion of the charge to a value corresponding to the SOC, based on the temperature Tb of the storage device 10, the integrated value Ie of charging current, and the internal resistance of the storage device 10. In this manner, the SOC(2) can be estimated at an early stage after the plug-in charge.

Also, the post-charge SOC estimating unit 214 may calculate the OCV, even after the system main relays SMR1, SMR2 are placed in the ON positions, by correcting the voltage Vb1 received from the power supply monitoring unit 24 so as to compensate for influences of for example, polarization, internal resistance, or the like.

The calculation condition determining unit 216 determines whether a calculation condition that the SOC(1), SOC(2), and the final integrated value Ie have been calculated is satisfied. For example, the calculation condition determining unit 216 may set a satisfaction determination flag to ON when the SOC(1), SOC(2) and the final integrated value Ie have been calculated.

The full-charge capacity calculating unit 218 calculates the full-charge capacity Smax(1) of this control cycle, based on the SOC(1), SOC(2) and the final integrated value Ie. More specifically, the full-charge capacity calculating unit 218 calculates the full-charge capacity Smax(1) of this cycle, according to an expression that Smax(1)=Ie/|SOC(1)−SOC(2)|×100.

When the final integrated value Ie is the predetermined value that represents cancellation of estimation of the full-charge capacity, the full-charge capacity calculating unit 218 may cancel calculation of the full-charge capacity Smax(1) of this cycle. Alternatively, the full-charge capacity calculating unit 218 may calculate the final full-charge capacity Smax(2) calculated in the last control cycle, as the full-charge capacity Smax(1) of this cycle.

The full-charge capacity calculating unit 218 may calculate the full-charge capacity Smax(1) of this cycle, for example, when the satisfaction determination flag is set to ON.

The full-charge capacity updating unit 220 determines whether the full-charge capacity Smax(1) of this control cycle is within a specified range defined by a predetermined upper limit and a predetermined lower limit. Namely, the full-charge capacity updating unit 220 continues the process of updating the full-charge capacity when the full-charge capacity Smax(1) of this cycle is within the specified range, namely, when the full-charge capacity Smax(1) is larger than the predetermined lower limit and smaller than the predetermined upper limit. The predetermined upper limit and lower limit are set so that the absolute value of the predetermined lower limit is larger than the absolute value of the predetermined upper limit. This is because the full-charge capacity has a tendency of decreasing since the storage device 10 deteriorates with time.

If, on the other hand, the full-charge capacity Smax(1) of this cycle is not within the specified range, the full-charge capacity updating unit 220 cancels or stops the process of updating the full-charge capacity. Namely, the full-charge capacity Smax(2) stored in the internal memory 50 is used as the current full-charge capacity for, for example, charge/discharge control of the storage device 10.

When the updating process is continued, the full-charge capacity, updating unit 220 calculates the final full-charge capacity Smax(3) of this control cycle according to a predetermined method. If the calculated full-charge capacity Smax(3) satisfies a certain condition, the full-charge capacity updating unit 220 updates the full-charge capacity by replacing the full-charge capacity Smax(2) stored in the internal memory 50 as the current full-charge capacity with the full-charge capacity Smax(3).

The full-charge capacity updating unit 220 calculates the full-charge capacity Smax(3) by assigning weights to the full-charge capacity Smax(1) of this cycle and the full-charge capacity Smax(2) stored as the current full-charge capacity in the internal memory 50.

Namely, when the full-charge capacity Smax(1) is smaller than the full-charge capacity Smax(2), the full-charge capacity updating unit 220 calculates the full-charge capacity Smax(3) using a first weight, based on the full-charge capacity Smax(1) and the full-charge capacity Smax(2). When the full-charge capacity Smax(1) is larger than the full charge capacity Smax(2), the full-charge capacity updating unit 220 calculates the full-charge capacity Smax(3) using a second weight that is different from the first weight, based on the full-charge capacity Smax(1) and the full-charge capacity Smax(2). In this embodiment, the first weight assigned to the first upper limit (i.e., the full-charge capacity Smax(1)) is set so as to be larger than the second weight assigned to the first upper limit.

More specifically, when the full-charge capacity Smax(1) is smaller than the full-charge capacity Smax(2) (namely, when the full-charge capacity is expected to decrease), the full-charge capacity updating unit 220 calculates the full-charge capacity Smax(3) according to the following expression (A).

$$Smax(3) = Kd \times Smax(1) + (1-Kd) \times Smax(2) \quad (A)$$

Or, when the full-charge capacity Smax(1) is equal to or smaller than the full-charge capacity Smax(2) (namely, when the full-charge capacity is expected to decrease), the full-charge capacity updating unit 220 may calculate the full-charge capacity Smax(3) according to the expression (A).

When the full-charge capacity Smax(1) is larger than the full-charge capacity Smax(2) (namely, when the full-charge capacity is expected to increase), the full-charge capacity updating unit 220 calculates the full-charge capacity Smax(3) according to the following expression (B).

$$Smax(3) = Ki \times Smax(1) + (1-Ki) \times Smax(2) \quad (B)$$

Or, when the full-charge capacity Smax(1) is equal to or larger than the full-charge capacity Smax(2) (namely, when the full-charge capacity is expected to increase), the full-charge capacity updating unit 220 calculates the full-charge capacity Smax(3) according to the expression (B).

Kd and Ki are predetermined coefficients, which are set to values within the range of 0 to 1. Kd is set to a value that is larger than Ki, since the full-charge capacity Smax(3) is more likely to decrease and less likely to increase, relative to the full-charge capacity Smax(2).

If the calculated full-charge capacity Smax(3) is within a specified range, the full-charge capacity updating unit 220 updates the full-charge capacity by replacing the current full-charge capacity Smax(2) stored in the internal memory 50 with the full-charge capacity Smax(3).

More specifically, if the calculated full-charge capacity Smax(3) is larger than a predetermined lower limit and is smaller than a predetermined upper limit, the full-charge capacity updating unit 220 replaces the current full-charge capacity Smax(2) stored in the internal memory 50 with the full-charge capacity Smax(3).

If the calculated full-charge capacity Smax(3) is not within the specified range, the full-charge capacity updating unit 220 maintains the current full-charge capacity Smax(2), and does not update the full-charge capacity.

In this embodiment, the CPU of the ECU executes programs stored in the internal memory 50 so as to implement the Pin-charge start determining unit 202, pre-charge SOC estimating unit 204, permitting condition determining unit 206, current integrating unit 208, charge completion determining unit 210, integrated value setting unit 212, post-charge SOC estimating unit 214, calculation condition determining unit 216, full-charge capacity calculating unit 218, and the full-charge capacity updating unit 220, which perform respective functions by software. However, the above-indicated units may be implemented or realized by hardware. The above-mentioned programs are recorded in a recording medium, which is installed on the vehicle.

Figure 4:
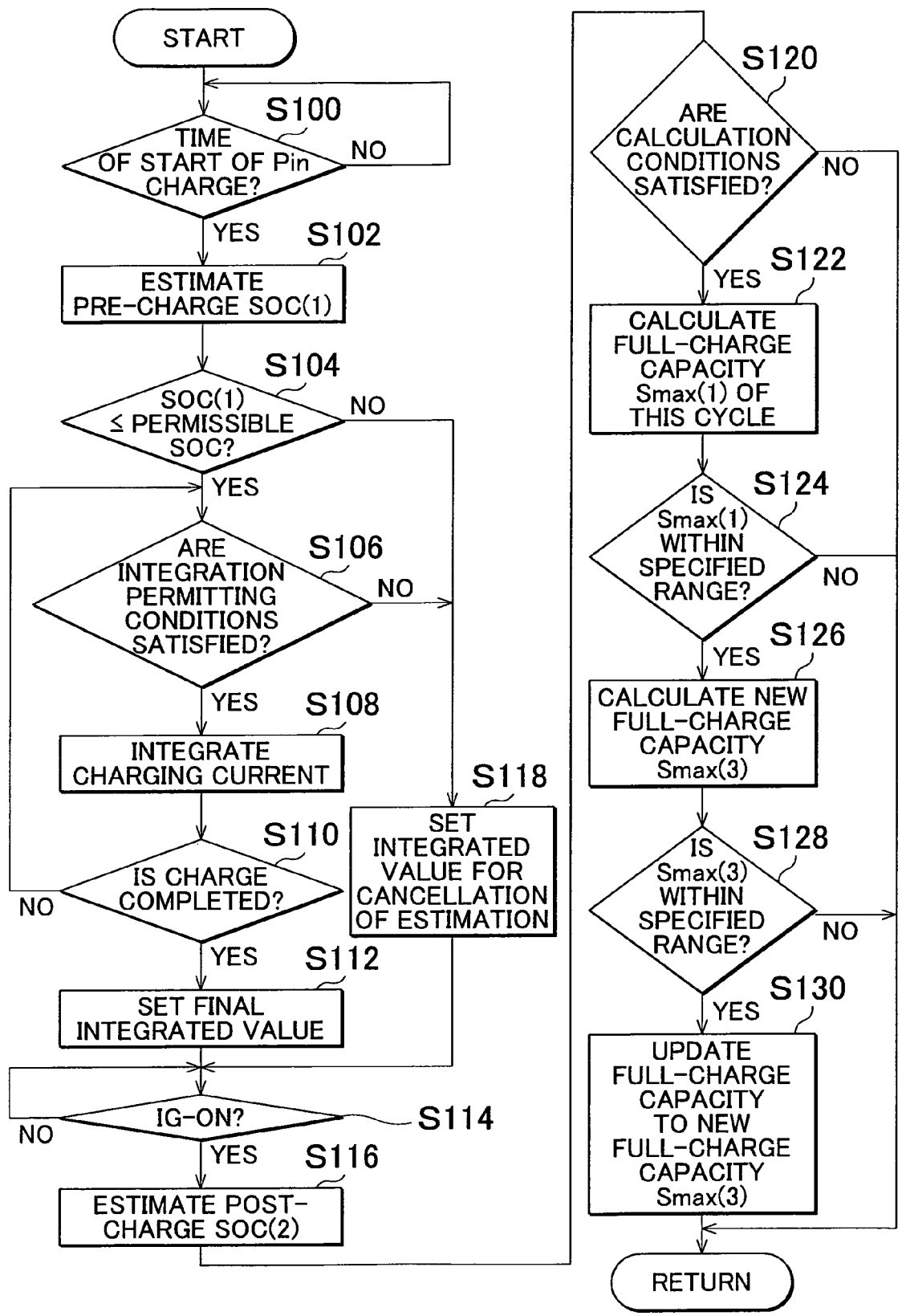
FIG. 4 is a flowchart showing the control structure of a program executed by the PM-ECU as the state-of-charge estimating device according to the embodiment of FIG. 1.

Referring to FIG. 4, the control structure of a program executed by the PM-ECU 22 as the state-of-charge estimating device according to this embodiment will be explained.

In step S100, the PM-ECU 22 determines whether it is the time of start of a plug-in charge. If it is the time of start of a plug-in charge (YES in S100), the control proceeds to step S102. If not (NO in S100), the control returns to step S100.

In step S102, the PM-ECU 22 estimates the SOC(1) prior to start of the plug-in charge. In step S104, the PM-ECU 22 determines whether the estimated pre-charge SOC(1) is equal to or smaller than a predetermined permissible SOC. If the pre-charge SOC(1) is equal to or smaller than the predetermined permissible SOC (YES in S104), the control proceeds to step S106. If not (NO in S104), the control proceeds to step S118.

In step S106, the PM-ECU 22 determines whether conditions for permitting integration of charging current are satisfied. The permitting conditions include conditions concerning the current Ib1, voltage Vb1 and the temperature Tb1. These conditions have been described above, and detailed description thereof will not be repeated. If the permitting conditions are satisfied (YES in S106), the control proceeds to step S108. If not (NO in S106), the control proceeds to step S118.

In step S108, the PM-ECU 22 calculates an integrated value of charging current. In step S110, the PM-ECU 22 determines whether the plug-in charge is completed. If the plug-in charge is completed (YES in S110), the control proceeds to step S112. If not (NO in S110), the control returns to step S106.

In step S112, the PM-ECU 22 sets the final integrated value Ie. In step S114, the PM-ECU 22 determines whether the ignition switch (IG) is turned ON. If the ignition switch (IG) is turned ON (YES in S114), the control proceeds to step S116. If not (NO in S114), the control returns to step S114.

In step S116, the PM-ECU 22 estimates the SOC(2) after the plug-in charge, based on the OCV of the storage device 10. In step S118, the PM-ECU 22 sets a predetermined value that represents cancellation of estimation of the full-charge capacity, as the final integrated value Ie.

In step S120, the PM-ECU 22 determines whether conditions under which the full-charge capacity Smax(1) of this control cycle is calculated are satisfied. The calculation conditions have been described above, and detailed description thereof will not be repeated. If the calculation conditions are satisfied (YES in S120), the control proceeds to step S122. If not (NO in S120), the current cycle of the process of FIG. 4 ends.

In step S122, the PM-ECU 22 calculates the full-charge capacity Smax(1) of this cycle. In step S124, the PM-ECU 22 determines whether the full-charge capacity Smax(1) of this cycle is within the above-mentioned specified range. The specified range of the full-charge capacity Smax(1) of this cycle has been described above, and detailed description thereof will not be repeated.

If the full-charge capacity Smax(1) of this cycle is within the specified range (YES in S124), the control proceeds to step S126. If not (NO in S124), the current cycle of the process of FIG. 4 ends.

In step S126, the PM-ECU 22 calculates a new full-charge capacity Smax(3). In step S128, the PM-ECU 22 determines whether the new full-charge capacity Smax(3) is within the above-mentioned specified range. The "specified range of the new full-charge capacity Smax(3)" has been described above, and detailed description thereof will not be repeated.

If the new full-charge capacity Smax(3) is within the specified range (YES in S128), the control proceeds to step S130. If not (NO in S128), the current cycle of the process of FIG. 4 ends. In step S130, the PM-ECU 22 updates the full-charge capacity by replacing the current full-charge capacity stored in the internal memory 50 with the new full-charge capacity Smax(3).

The operation of the PM-ECU 22 as the state-of-charge estimating device according to this embodiment based on the above-described control structure and flowchart will be described with reference to FIG. 5 and FIG. 6.

Suppose the vehicle is at rest, and the system main relays SMR1, SMR2 are in the OFF positions, while the charging plug 25 of the external power supply 28 is not connected to the charger connector 27 of the vehicle 100, and no plug-in charge is carried out.

Figure 5:
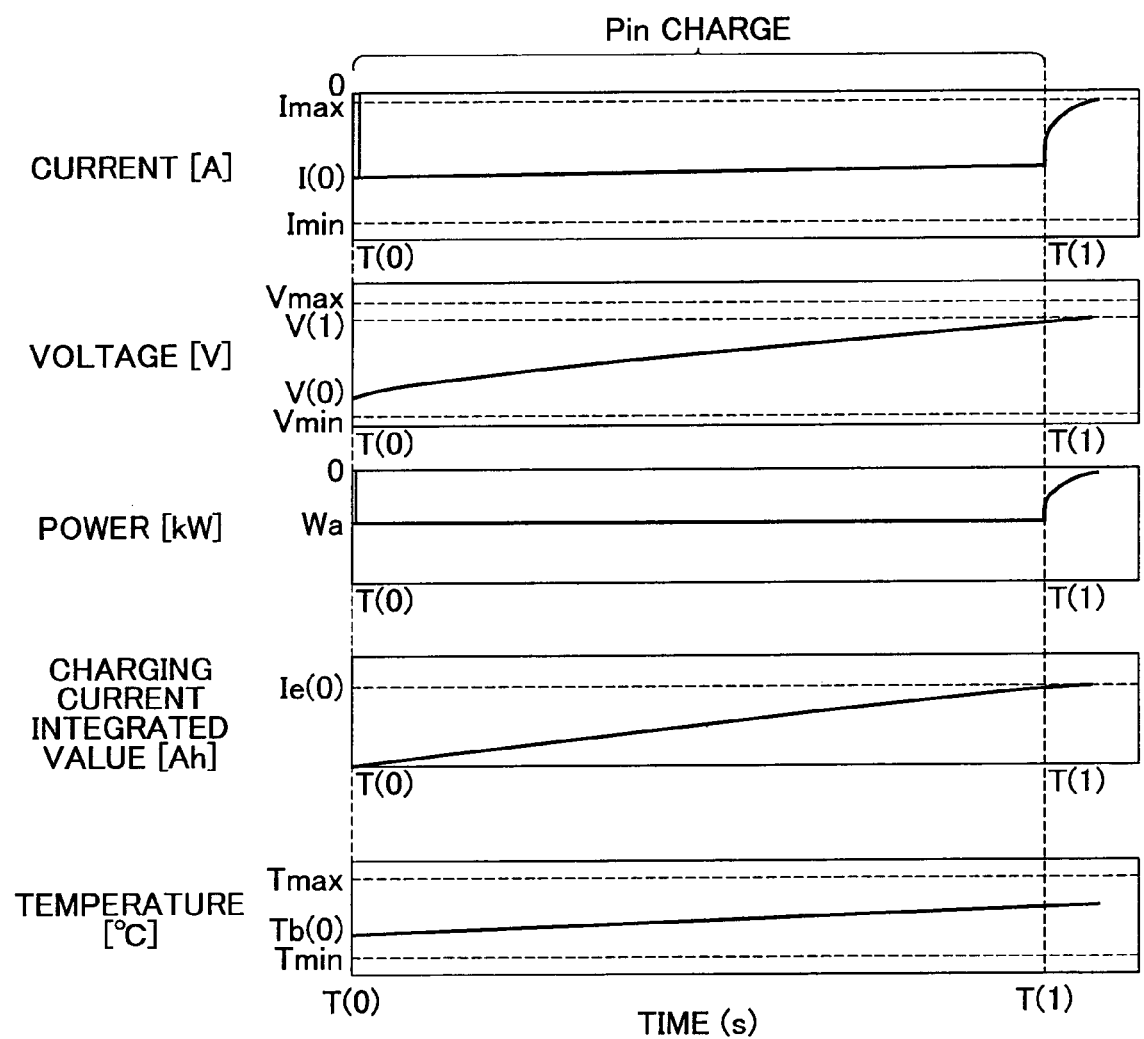
FIG. 5 is a timing chart showing the operation of the PM-ECU as the state-of-charge estimating device according to the embodiment of FIG. 1.

In the above situation, if the user connects the charging plug 25 to the charger connector 27 at time T(0) in FIG. 5, it is determined that it is the time of start of a plug-in charge (YES in S100). Therefore, the SOC(1) prior to the plug-in charge is estimated (S102) before the system main relays SMR1, SMR2 are placed in the ON positions.

If the estimated SOC(1) is equal to or smaller than the predetermined permissible SOC (YES in S104), it is determined whether the permitting conditions concerning the current Ib1, voltage Vb1 and the temperature Tb1 are satisfied (S106). For example, when the current I(0) received from the power supply monitoring unit 24 is smaller than the upper limit Imax and larger than the lower limit Imin, and the voltage V(0) is smaller than the upper limit Vmax and larger than the lower limit Vmin, while the temperature T(0) is lower than the upper limit Tmax and higher than the lower limit Tmin, it is determined that the permitting conditions are satisfied (YES in S106). In this case, the plug-in charge is started, and the integrated value of charging current is calculated (S108).

The integrated value of charging current is calculated (S108) until the plug-in charge is completed (NO in S110) as long as any of the permitting conditions ceases to be satisfied during the plug-in charge. If the plug-in charge is completed at time T(1) in FIG. 5 (YES in S110), the integrated value Ie(0) of charging current over a period from time T(0) to time T(1) is set as the final integrated value Ie (S112).

If the estimated SOC(1) is larger than the predetermined permissible SOC (NO in S104), or at least one of the conditions concerning the current Ib1, voltage Vb1 and the temperature Tb1 is not satisfied (NO in S106), the value that represents cancellation of estimation of the full-charge capacity is set as the integrated value Ie (S118).

When the ignition switch (IG) is turned ON after completion of the plug-in charge (YES in S114), the post-charge SOC(2) after the plug-in charge is estimated (S116).

If the SOC(1), SOC(2), and the integrated value Ie are calculated (YES in S120), the full-charge capacity Smax(1) of this control cycle is calculated (S122). If the calculated full-charge capacity Smax(1) of this cycle is within the specified range (YES in S124), the new full-charge capacity Smax(3) is calculated.

For example, when the full-charge capacity Smax(1) of this control cycle is within the specified range defined by the upper limit and lower limit of the full-charge capacity of this cycle, as shown in FIG. 6, the full-charge capacity Smax(3) is calculated.

If the full-charge capacity Smax(1) of this cycle is smaller than the current full-charge capacity Smax(2) stored in the internal memory 50, the full-charge capacity Smax(3) is calculated according to the above-indicated expression (A).

If, on the other hand, the full-charge capacity Smax'(1) of this cycle is larger than the current full-charge capacity Smax (2) stored in the internal memory 50, the full-charge capacity Smax'(3) is calculated according to the above-indicated expression (B). Since the value of Kd is larger than the value of Ki, the full-charge capacity Smax(3) is more likely to decrease and is less likely to increase.

When the new full-charge capacity Smax(3) thus calculated is within the specified range (YES in S128), the current full-charge capacity stored in the internal memory 50 is replaced with or updated to the new full-charge capacity Smax(3) (S130).

As described above, the use of the external power supply for charging makes it possible to charge the storage device with a constant charging current; therefore, the state-of-charge estimating device of this embodiment is able to calculate the integrated value of the charging current with high accuracy. Also, since the external charging (or plug-in charge) using the external power supply is carried out while the vehicle is at rest, large variations are less likely or unlikely to appear in the state of charge of the secondary battery. Therefore, the SOC(1) at the time of start of charge and the SOC(2)

at the completion of charge can be calculated with high accuracy. Accordingly, the upper limit of the state of charge of the storage device can be estimated with high accuracy, based on the SOC(1), SOC(2) and the integrated value Ie of charging current. It is thus possible to provide a state-of-charge estimating device that estimates the upper limit of the state of charge of the storage device with high accuracy, and such a method of estimating the state of charge.

In the state-of-charge estimating device of this embodiment, the first weight is set so that the first weight assigned to the first upper limit (Smax(1)) is larger than the second weight assigned to the first upper limit. Therefore, when the first upper limit (Smax(1)) is reduced to be smaller than the second upper limit (Smax(2)), the third upper limit (Smax(3)) is more likely to be reduced. When the first upper limit (Smax(1)) is increased to be larger than the second upper limit (Smax(2)), the third upper limit (Smax(3)) is less likely to be increased. By changing the tendencies of increasing and reducing the third upper limit in this manner, the third upper limit can be changed in agreement with chronological changes of the storage device. Therefore, the full-charge capacity of the storage device can be detected with high accuracy.

In this embodiment, the OCV used for estimating the SOC (1) at the time of start of plug-in charge, OCV used for estimating the SOC(2) at the completion of plug-in charge, and the integrated value Ie of charging current are detected assuming that the actual measurement values obtained by the voltage sensor and current sensor are true values. However, the output values of these sensors involve fluctuations or variations due to measurement errors and individual differences Therefore, a population with respect to which a predetermined reliability (e.g., 98% or higher) is assured may be estimated from output values (samples) of a plurality of sensors, and a predetermined percentile (e.g., 60 percentile) of the estimated population may be regarded as true values. This statistical process is performed on the output values of the voltage sensor and the output values of the current sensor, so that the OCV and integrated value Ie used for estimating the SOC(1) and SOC(2) can be detected with high accuracy. It is to be understood that the predetermined reliability and predetermined percentile are not particularly limited, but may be determined according to the degree of individual differences of sensors, characteristics, the laws and regulations, and so forth.

In this embodiment, for example, during a plug-in charge effected with a constant charging current, the power supply monitoring unit 24 or the PM-ECU 22 stores the current Ib1 and voltage Vb1 received from the current sensor 14 and the voltage sensor 16 at predetermined calculation cycles, into an internal memory, or the like. The power supply monitoring unit 24 or PM-ECU 22 executes the above-described statistical process at predetermined time intervals each of which is longer than the above-mentioned predetermined calculation cycle, with respect to the output values of the sensors obtained over a period corresponding to the time interval. The power supply monitoring unit 24 or PM-ECU 22 may set the predetermined percentile of the population estimated by the above-described statistical process, as true values.

While the invention has been described with reference to exemplary embodiments thereof, it is to be understood that the invention is not limited to the described embodiments or constructions. To the contrary, the invention is intended to cover various modifications and equivalent arrangements. In addition, while the various elements of the disclosed invention are shown in various example combinations and configurations, other combinations and configurations, including more, less or only a single element, are also within the scope of the appended claims.

The invention claimed is:

1. A state-of-charge estimating device for estimating a full-charge capacity of a storage device that is installed on a vehicle and can be charged using a charging device outside the vehicle, comprising:
   a first estimating unit that estimates a first state of charge of the storage device when the storage device starts being charged by the charging device;
   an integrating unit that calculates an integrated value of charging current over a period of time from start of charging of the storage device by the charging device to completion of the charging;
   a second estimating unit that estimates a second state of charge of the storage device at the completion of the charging of the storage device by the charging device;
   a third estimating unit that estimates a first full-charge capacity, based on the first state of charge, the second state of charge, and the integrated value of charging current; and
   a calculating unit that calculates a final third full-charge capacity in a current charging control cycle, based on the first full-charge capacity of the current charging control cycle and a final second full-charge capacity calculated in a last charging control cycle,
   the calculating unit calculates the third full-charge capacity using a first weight, based on the first full-charge capacity and the second full-charge capacity, when the first full-charge capacity is smaller than the second full-charge capacity,
   the calculating unit calculates the third full-charge capacity using a second weight that is different from the first weight, based on the first full-charge capacity and the second full-charge capacity, when the first full-charge capacity is equal to or larger than the second full-charge capacity, and
   wherein the first weight assigned to the first full-charge capacity is set to be larger than the second weight assigned to the first full-charge capacity.

2. The state-of-charge estimating device according to claim 1, wherein the calculating unit calculates the third full-charge capacity when the first full-charge capacity is within a specified range defined by a predetermined full-charge capacity and a predetermined lower limit.

3. A state-of-charge estimating device for estimating a full-charge capacity of a storage device that is installed on a vehicle and can be charged using a charging device outside the vehicle, comprising:
   a first estimating unit that estimates a first state of charge of the storage device when the storage device starts being charged by the charging device;
   an integrating unit that calculates an integrated value of charging current over a period of time from start of charging of the storage device by the charging device to completion of the charging;
   a second estimating unit that estimates a second state of charge of the storage device at the completion of the charging of the storage device by the charging device;
   a third estimating unit that estimates a first full-charge capacity, based on the first state of charge, the second state of charge, and the integrated value of charging current; and
   a calculating unit that calculates a final third full-charge capacity in a current charging control cycle, based on the first full-charge capacity of the current charging control cycle and a final second full-charge capacity calculated in a last charging control cycle, wherein the calculating unit calculates the third full-charge capacity using a first weight, based on the first full-charge capacity and the second full-charge capacity, when the first full-charge capacity is equal to or smaller than the second full-charge capacity, wherein the calculating unit calculates the third full-charge capacity using a second weight that is different from the first weight, based on the first full-charge capacity and the second full-charge capacity, when the first full-charge capacity is larger than the second full-charge capacity, and wherein the first weight assigned to the first full-charge capacity is set to be larger than the second weight assigned to the first full-charge capacity.

4. The state-of-charge estimating device according to claim 1, wherein, when the third full-charge capacity is within a specified range defined by a predetermined full-charge capacity and a predetermined lower limit, the calculating unit replaces the final second full-charge capacity calculated in the last charging control cycle, with the third full-charge capacity, so as to set the third full-charge capacity as a current full-charge capacity.

5. A state-of-charge estimating method for estimating a full-charge capacity of a storage device that is installed on a vehicle and can be charged using a charging device outside the vehicle, characterized by comprising:

estimating a first state of charge of the storage device when the storage device starts being charged by the charging device;

calculating an integrated value of charging current over a period of time from start of charging of the storage device by the charging device to completion of the charging;

estimating a second state of charge of the storage device at the completion of the charging of the storage device by the charging device;

estimating a first full-charge capacity, based on the first state of charge, the second state of charge, and the integrated value of charging current; and calculating a final third full-charge capacity in a current charging control cycle, based on the first full-charge capacity of the current charging control cycle, and a final second full-charge capacity calculated in a last charging control cycle, wherein the third full-charge capacity is calculated using a first weight, based on the first full-charge capacity and the second full-charge capacity, when the first full-charge capacity is smaller than the second full-charge capacity, wherein the third full-charge capacity is calculated using a second weight that is different from the first weight, based on the first full-charge capacity and the second full-charge capacity, when the first full-charge capacity is equal to or larger than the second full-charge capacity, and wherein the first weight assigned to the first full-charge capacity is set to be larger than the second weight assigned to the first full-charge capacity.

6. The state-of-charge estimating method according to claim 5, wherein the third full-charge capacity is calculated when the first full-charge capacity is within a specified range defined by a predetermined full-charge capacity and a predetermined lower limit.

7. A state-of-charge estimating method for estimating a full-charge capacity of a storage device that is installed on a vehicle and can be charged using a charging device outside the vehicle, comprising:

estimating a first state of charge of the storage device when the storage device starts being charged by the charging device;

calculating an integrated value of charging current over a period of time from start of charging of the storage device by the charging device to completion of the charging;

estimating a second state of charge of the storage device at the completion of the charging of the storage device by the charging device;

estimating a first full-charge capacity, based on the first state of charge, the second state of charge, and the integrated value of charging current; and calculating a final third full-charge capacity in a current charging control cycle, based on the first full-charge capacity of the current charging control cycle and a final second full-charge capacity calculated in a last charging control cycle, wherein the third full-charge capacity is calculated using a first weight, based on the first full-charge capacity and the second full-charge capacity, when the first full-charge capacity is equal to or smaller than the second full-charge capacity, wherein the third full-charge capacity is calculated using a second weight that is different from the first weight, based on the first full-charge capacity and the second full-charge capacity, when the first full-charge capacity is larger than the second full-charge capacity, and wherein the first weight assigned to the first full-charge capacity is set to be larger than the second weight assigned to the first full-charge capacity.

8. The state-of-charge estimating method according to claim 5, wherein, when the third full-charge capacity is within a specified range defined by a predetermined full-charge capacity and a predetermined lower limit, the final second full-charge capacity calculated in the last charging control cycle is replaced with the third full-charge capacity, and the third full-charge capacity is set as a current full-charge capacity.

9. The state-of-charge estimating device according to claim 3, wherein the calculating unit calculates the third full-charge capacity when the first full-charge capacity is within a specified range defined by a predetermined full-charge capacity and a predetermined lower limit.

10. The state-of-charge estimating device according to claim 3, wherein, when the third full-charge capacity is within a specified range defined by a predetermined full-charge capacity and a predetermined lower limit, the calculating unit replaces the final second full-charge capacity calculated in the last charging control cycle, with the third full-charge capacity, so as to set the third full-charge capacity as a current full-charge capacity.

11. The state-of-charge estimating method according to claim 7, wherein the third full-charge capacity is calculated when the first full-charge capacity is within a specified range defined by a predetermined full-charge capacity and a predetermined lower limit.

12. The state-of-charge estimating method according to claim 7, wherein, when the third full-charge capacity is within a specified range defined by a predetermined full-charge capacity and a predetermined lower limit, the final second full-charge capacity calculated in the last charging control cycle is replaced with the third full-charge capacity, and the third full-charge capacity is set as a current full-charge capacity.

* * * * *

UNITED STATES PATENT AND TRADEMARK OFFICE
CERTIFICATE OF CORRECTION

| | | |
|---|---|---|
| PATENT NO. | : 8,912,761 B2 | Page 1 of 1 |
| APPLICATION NO. | : 13/379965 | |
| DATED | : December 16, 2014 | |
| INVENTOR(S) | : Junta Izumi | |

It is certified that error appears in the above-identified patent and that said Letters Patent is hereby corrected as shown below:

Claims

In Column 17, Line 26, in Claim 5, before "comprising:", delete "characterized by"

Signed and Sealed this
Twenty-third Day of February, 2016

Michelle K. Lee
*Director of the United States Patent and Trademark Office*